(12) United States Patent
Prasad et al.

(10) Patent No.: US 11,870,433 B2
(45) Date of Patent: Jan. 9, 2024

(54) SOLID-STATE MULTI-SWITCH DEVICE

(71) Applicant: GM GLOBAL TECHNOLOGY OPERATIONS LLC, Detroit, MI (US)

(72) Inventors: Rashmi Prasad, Troy, MI (US); Chandra S. Namuduri, Troy, MI (US); Muhammad H. Alvi, Troy, MI (US); Ronald O. Grover, Jr., Northville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 3 days.

(21) Appl. No.: 17/736,165

(22) Filed: May 4, 2022

(65) Prior Publication Data

US 2023/0361771 A1  Nov. 9, 2023

(51) Int. Cl.

| | |
|---|---|
| H01L 21/48 | (2006.01) |
| H01L 23/00 | (2006.01) |
| H01L 23/057 | (2006.01) |
| H01L 25/07 | (2006.01) |
| H03K 17/687 | (2006.01) |
| H01L 23/053 | (2006.01) |
| H01L 23/373 | (2006.01) |
| H01L 23/367 | (2006.01) |
| H03K 17/041 | (2006.01) |

(52) U.S. Cl.
CPC ......... *H03K 17/687* (2013.01); *H01L 23/053* (2013.01); *H01L 23/367* (2013.01); *H01L 23/3735* (2013.01); *H03K 17/04106* (2013.01)

(58) Field of Classification Search
None
See application file for complete search history.

(56) References Cited

U.S. PATENT DOCUMENTS

| | | | | |
|---|---|---|---|---|
| 4,172,272 A | * | 10/1979 | Schneider | H05K 5/0026 174/559 |
| 5,751,058 A | * | 5/1998 | Matsuki | H01L 25/072 361/728 |
| 10,556,482 B2 | | 2/2020 | Coppola et al. | |
| 11,071,225 B2 | | 7/2021 | Namuduri et al. | |
| 11,171,571 B2 | | 11/2021 | Prasad et al. | |

\* cited by examiner

*Primary Examiner* — Kenneth B Wells
(74) *Attorney, Agent, or Firm* — Quinn IP Law

(57) ABSTRACT

An electronic solid-state switch assembly includes a base plate and a heat exchanger; an electrically insulating layer and a direct bonded substrate affixed to the base plate; a first terminal and a second terminal; a plurality of power transistors; a plurality of gate drivers; a communication interface, a current sensor, and a snubber circuit; and a controller. The plurality of gate drivers are operatively coupled to the plurality of power transistors. The plurality of power transistors are arranged in parallel on the direct bonded substrate between the first terminal and the second terminal. The plurality of power transistors are electrically connected to the first terminal and to the second terminal. The controller is in communication with the plurality of gate drivers, the current sensor, and the communication interface. The controller is configured to control, via the plurality of gate drivers, the plurality of power transistors.

20 Claims, 6 Drawing Sheets

SOLID-STATE MULTI-SWITCH DEVICE

INTRODUCTION

The present disclosure relates to electrical components, and more specifically, to electronic solid-state switches and assemblies.

Existing high-voltage, high current electromechanical relays are bulky (e.g., with a mass greater than 0.5 kg), have slow switching speeds (e.g., switching speed greater than 10 ms) and are prone to contact welding during high current switching due to contact bounce. Further, existing, electromechanical relays produce audible noise during switching. Therefore, there is a need to develop a switch that is lightweight, has fast switching speeds, and is reliable. Further, for fault tolerant and/or dual-purpose applications, it may be useful to efficiently control in both directions. For example, for efficient control of reconfigurable storage in both charging and discharging modes, bidirectionally controllable solid-state switches with low voltage drops are useful.

Solid-state switches cannot absorb high energy during turn-off under shorted or overload conditions if the power source has significant inductance. Therefore, there is a need for a low power consumption and compact gate driver and protection circuit for a solid-state switch. Furthermore, there is a need for a switch device capable of carrying electric power for electrified powertrain operation and charging, is compact in size, is lightweight, able to manage temperature, has fast switching speeds, and is quiet.

SUMMARY

The concepts described herein relate to an electronic solid-state switch assembly that includes a base plate and a heat exchanger; an electrically insulating layer and a direct bonded substrate affixed to the base plate; a first terminal and a second terminal; a plurality of power transistors; a plurality of gate drivers; a communication interface, a current sensor, and a snubber circuit; and a controller. The plurality of gate drivers are operatively coupled to the plurality of power transistors. The plurality of power transistors are arranged in parallel on the direct bonded substrate between the first terminal and the second terminal. The plurality of power transistors are electrically connected to the first terminal and to the second terminal. The controller is in communication with the plurality of gate drivers, the current sensor, and the communication interface. The controller is configured to control, via the plurality of gate drivers, the plurality of power transistors.

An aspect of the disclosure includes the heat exchanger having a heat sink portion and a liquid cooled base, and the heat sink portion being thermally coupled to the base plate.

Another aspect of the disclosure includes the heat sink portion being a pin-finned heat sink.

Another aspect of the disclosure includes the electrically insulating layer being a ceramic isolator, and the direct bonded substrate being one of a direct bonded copper substrate or a direct bonded aluminum substrate.

Another aspect of the disclosure includes wherein the electrically insulating layer being thermally conductive.

Another aspect of the disclosure includes the electronic solid-state switch assembly being controllable to one of an on-state or an off-state, wherein the electronic solid-state switch assembly is arranged to block at least 500V in either a first direction of current flow or a second direction of current flow when controlled to the off-state.

Another aspect of the disclosure includes the electronic solid-state switch assembly being configured to carry an electrical current of at least 300 A when controlled to the on-state.

Another aspect of the disclosure includes the plurality of power transistors arranged in parallel being one of a plurality of Si IGBT power transistors, a plurality of SiC JFET transistors, a plurality of Si/SiC MOSFET transistors, or a plurality of GaN FET transistors.

Another aspect of the disclosure includes the plurality of power transistors arranged in parallel being a plurality of a combination one or more of Si IGBT transistors, SiC JFET transistors, Si/SiC MOSFET transistors, and GaN FET power transistors.

Another aspect of the disclosure includes each of the plurality of one or more of Si IGBT, SiC JFET, Si/SiC MOSFET, GaN FET power transistors having a minimum surface area of 20 $mm^2$.

Another aspect of the disclosure includes each of the plurality of power transistors being arranged in parallel to achieve a scalable current rating between 200 A and 2,000 A, wherein the scalable current rating is based upon a quantity of the power transistors that are arranged in parallel.

Another aspect of the disclosure includes the temperature sensor arranged to monitor temperature therein.

Another aspect of the disclosure includes the snubber circuit being a combination of a resistor and a capacitor, wherein the resistor and the capacitor are sized to limit overvoltage during a switch-off event.

Another aspect of the disclosure includes the current sensor being a non-dissipative differential current sensor that is integrated into one of the first terminal or the second terminal.

Another aspect of the disclosure includes the current sensor being a non-dissipative differential magnetic field based current sensor that is integrated into one of the first terminal or the second terminal.

Another aspect of the disclosure includes the electrically insulating layer being a ceramic material.

Another aspect of the disclosure includes the base plate being fabricated from at least one of copper, aluminum, molybdenum, an alloy thereof, or a thermally conductive metal matrix composite.

Another aspect of the disclosure includes the communication interface being an isolated bidirectional serial communication link that is coupled to a second controller.

Another aspect of the disclosure includes a bi-directional electronic solid-state switch assembly that includes a base plate including a thermally conductive, electrically insulating layer and a direct bonded substrate affixed to the base plate; a first terminal and a second terminal; a plurality of power transistors electrically connected in parallel between the first and second terminals; a plurality of gate drivers arranged to control the plurality of power transistors; a communication interface, a current sensor, and a snubber circuit; and a controller. The controller is in communication with the plurality of gate drivers, the current sensor, and the communication interface; and is configured to control, via the plurality of gate drivers, the plurality of power transistors.

The electronic solid-state switch assembly described herein may be employed in a high-voltage battery system on a vehicle. The disclosed switch assembly is intended to be lightweight, with fast switching speed and quiet operation. Further, the disclosed switch assembly may achieve one or more desirable benefits, including continuously carrying at least 400 amperes direct current with a voltage drop of less than one volt; being scalable; having fast fault interruptibility; having current limiting in the event of a fault; and having repeatability and reliability.

The above features and advantages, and other features and advantages, of the present teachings are readily apparent from the following detailed description of some of the best modes and other embodiments for carrying out the present teachings, as defined in the appended claims, when taken in connection with the accompanying drawings.

Figure 1:
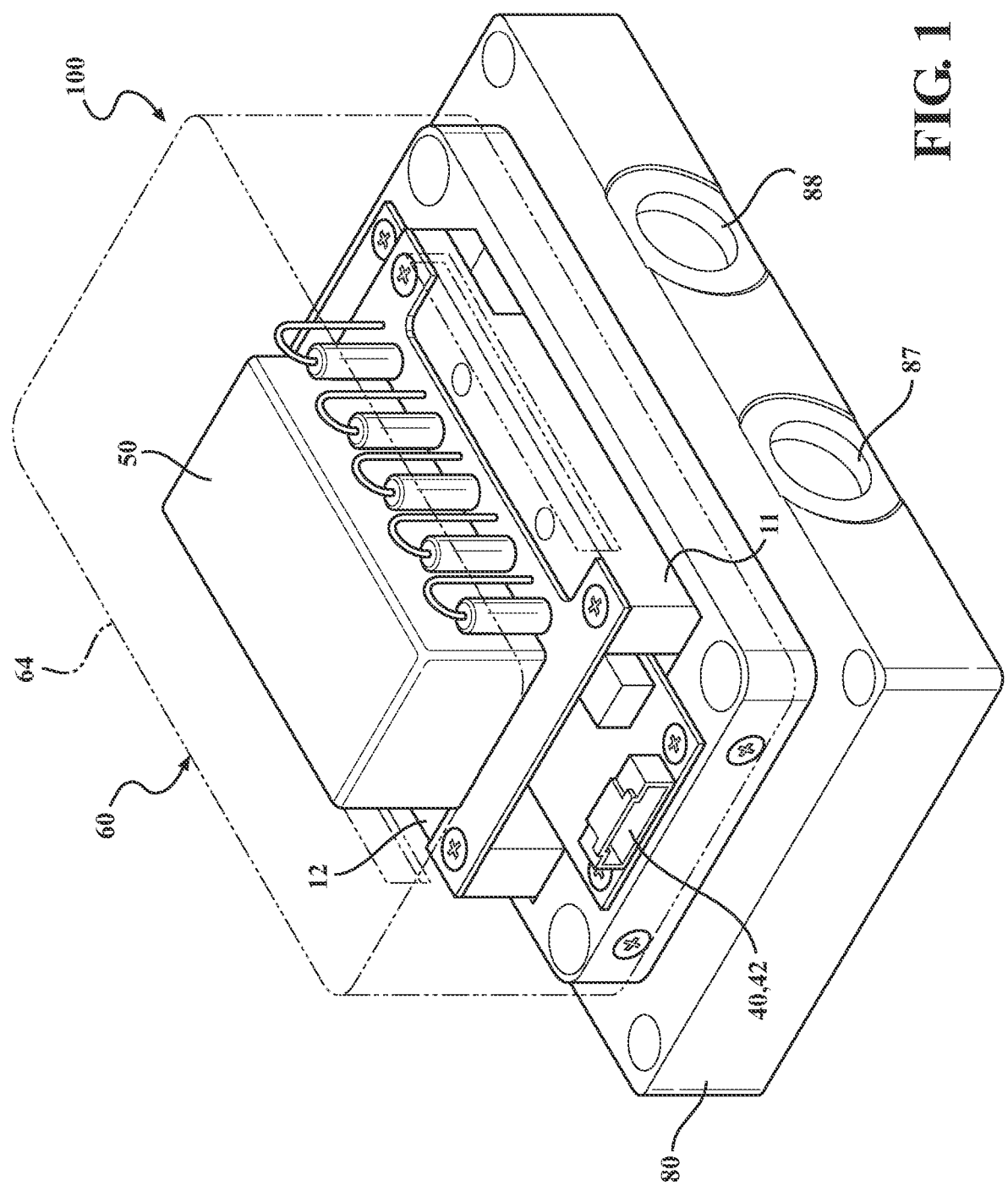
FIG. 1 is an isometric view of an embodiment of an electronic solid-state switch assembly, in accordance with the disclosure.
Figure 2:
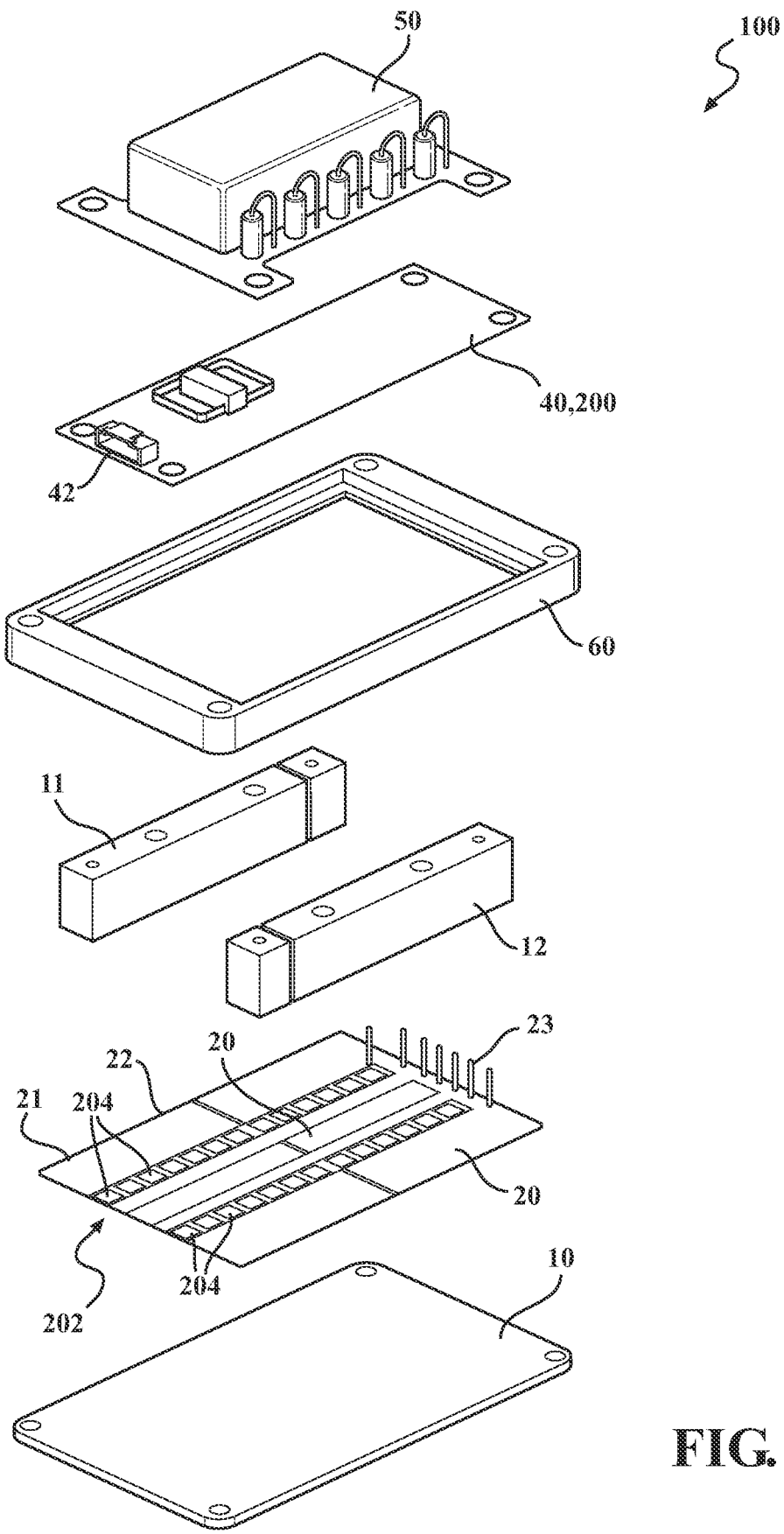
FIG. 2 schematically illustrates an exploded isometric view of an embodiment of an electronic solid-state switch assembly, in accordance with the disclosure.
Figure 3:
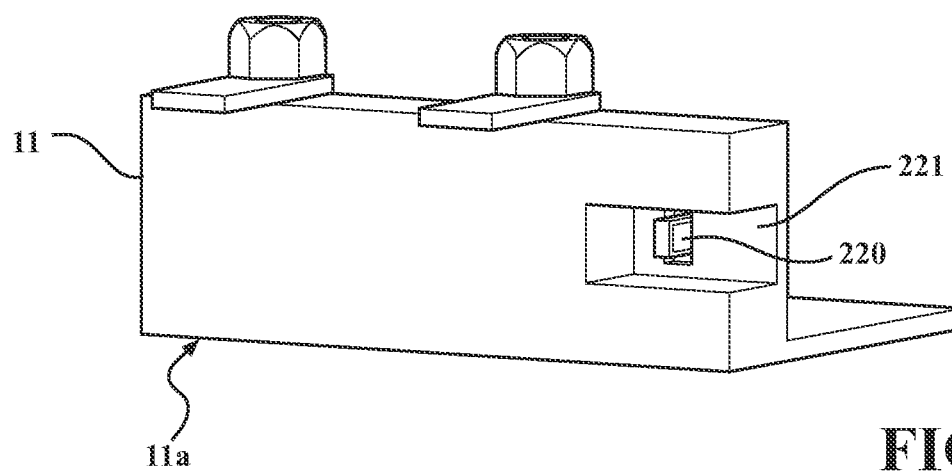
FIG. 3 schematically illustrates an isometric view of a terminal for an electronic solid-state switch assembly, in accordance with the disclosure.
Figure 4A:
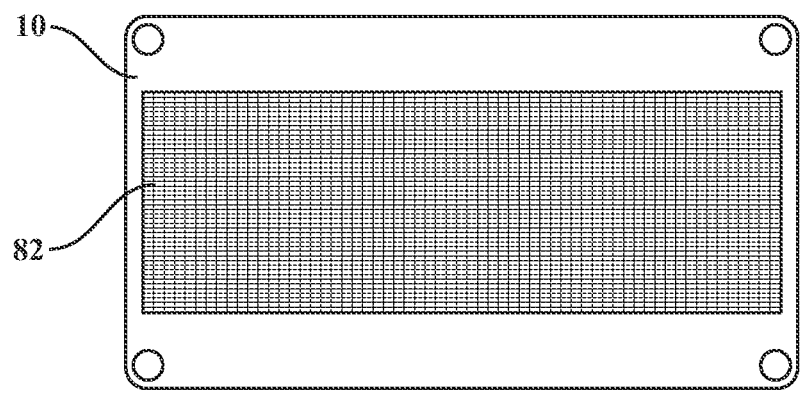
FIGS. 4A and 4B schematically illustrate a bottom view and an end view, respectively, of a base plate and heat sink for an electronic solid-state switch assembly, in accordance with the disclosure.
Figure 4B:
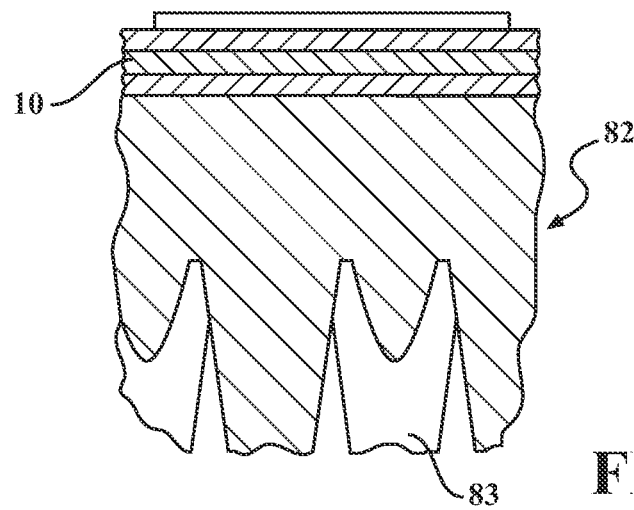
Figure 5:
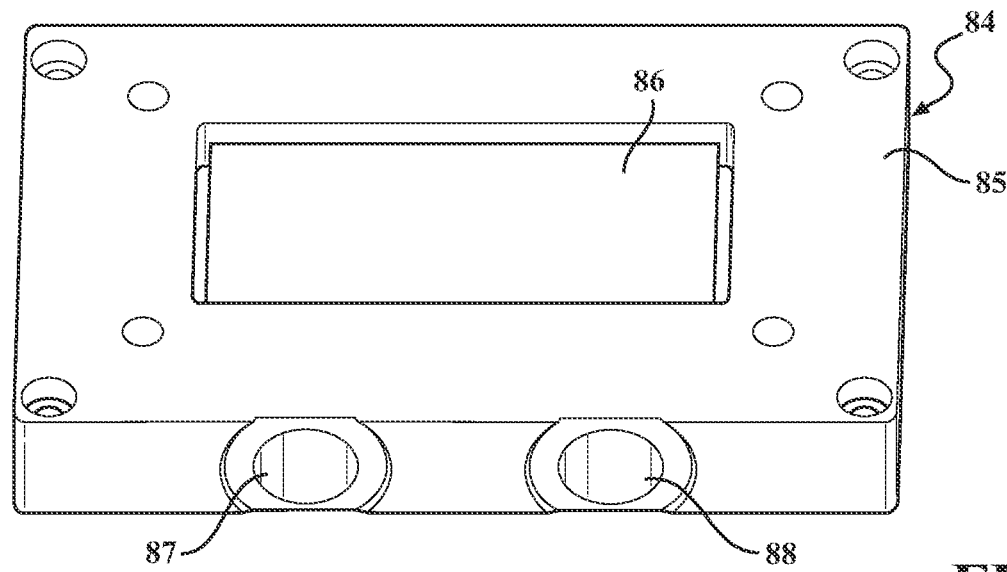
FIG. 5 schematically illustrates an isometric view of a liquid-cooled assembly for an electronic solid-state switch assembly, in accordance with the disclosure.
Figure 6:
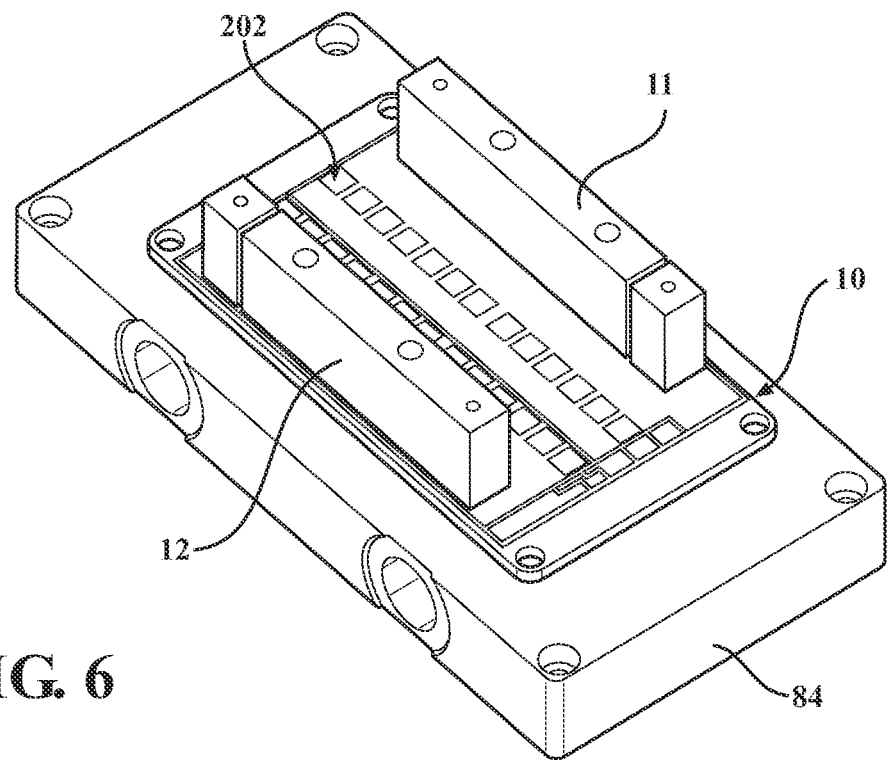
FIG. 6 schematically illustrates an isometric view of a liquid-cooled assembly on which is assembled a base plate and heat sink for an electronic solid-state switch assembly, in accordance with the disclosure.
Figure 7:
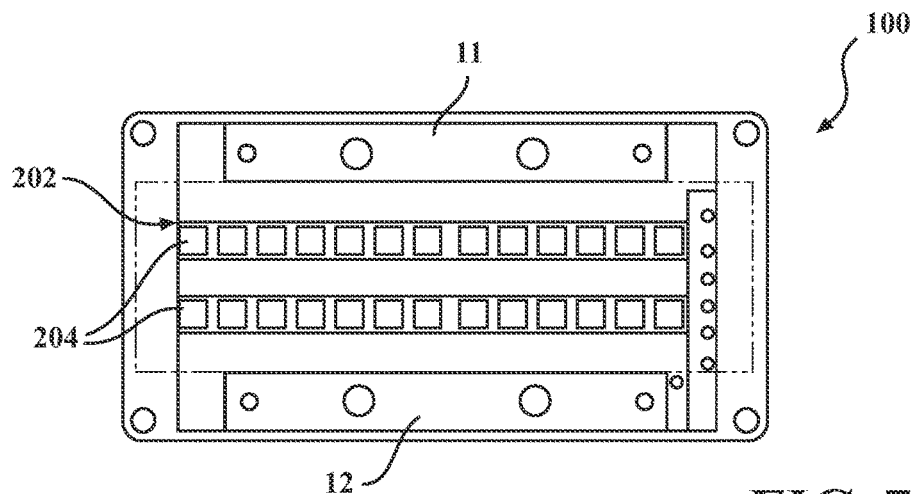
FIG. 7 schematically illustrates a top view of a base plate and heat sink for an electronic solid-state switch assembly, in accordance with the disclosure.

The appended drawings are not necessarily to scale, and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The components of the disclosed embodiments, as described and illustrated herein, may be arranged and designed in a variety of different configurations. Thus, the following detailed description is not intended to limit the scope of the disclosure, as claimed, but is merely representative of possible embodiments thereof. In addition, while numerous specific details are set forth in the following description in order to provide a thorough understanding of the embodiments disclosed herein, some embodiments can be practiced without some of these details. Moreover, for the purpose of clarity, certain technical material that is understood in the related art has not been described in detail to avoid unnecessarily obscuring the disclosure. For purposes of convenience and clarity, directional terms such as top, bottom, left, right, up, over, above, below, beneath, rear, and front, may be used with respect to the drawings. These and similar directional terms are not to be construed to limit the scope of the disclosure. Furthermore, the disclosure, as illustrated and described herein, may be practiced in the absence of an element that is not specifically disclosed herein.

Embodiments of the present disclosure may be described herein in terms of functional and/or logical block components and various processing steps. Such block components may be realized by hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with a number of systems, and that the systems described herein are merely exemplary embodiments of the present disclosure.

The following detailed description is merely exemplary in nature and is not intended to limit the application and uses. Furthermore, there is no intention to be bound by an expressed or implied theory presented herein. Throughout the drawings, corresponding reference numerals indicate like or corresponding parts and features.

As used herein, the term "system" may refer to one of or a combination of mechanical and electrical actuators, sensors, controllers, application-specific integrated circuits (ASIC), combinatorial logic circuits, software, firmware, and/or other components that are arranged to provide the described functionality.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. Alternative or additional functional relationships or physical connections may be present in an embodiment of the present disclosure.

The use of ordinals such as first, second and third does not necessarily imply a ranked sense of order, but merely distinguishes between multiple instances of an act or structure.

Referring now to the drawings, an embodiment of a bidirectional electronic solid-state switch assembly (switch assembly) 100 in the form of a bi-directional solid-state electronic relay for conducting or blocking AC electric power flow is illustrated. In one embodiment, and as described herein, the switch assembly 100 provides switching on/off times that are less than a millisecond, and blocks a minimum of 400V in either direction during an off-state. The switch assembly 100 includes power transistor circuit 202 that is composed of an arrangement of a plurality of power transistors 204. The power transistors 204 may be fabricated as silicon integrated gate bipolar transistors (Si IGBTs), silicon carbide (SiC) metal-oxide-silicon field effect transistors (MOSFETs), SiC junction field effect transistors (JFETs), or gallium nitride (GaN) field effect transistors (FETs). The power transistors 204 each have a minimum area per transistor that is at least 2025 mm$^2$. The power transistors 204 are arranged on direct bonded substrate (DBS) that is fabricated from copper, aluminum, aluminum nitride, or \silicon nitride with AMB with integrated gate resistors. High current power terminals are directly attached to the power substrate with integrated provisions (e.g., tapped holes, sensor/snubber mounting) for external connections. An integrated gate driver circuit is included for driving the device with appropriate gate voltages and currents. A built-in protection circuit protects against overvoltage, short circuit, and overtemperature events, and provides turn-off energy absorption via a snubber circuit. An integrated control circuit also provides fault monitoring and reporting. A base plate is fabricated from copper or aluminum, with pin-fins in one embodiment, provides a thermal interface material (TIM) with high thermal conductivity and an integrated heat sink having a maximum predetermined coolant-to-die junction thermal resistance. A programmable fuse provides for over-current turn-off, and is resettable. On-resistance of the switch assembly less than 5 mΩ. An off-state is able to withstand voltage that is greater than 500V in one embodiment. A liquid cooled base is provided to enhance heat transfer away from the switch assembly. An overall volume of the switch assembly is not to exceed 0.45 L in one embodiment, and an overall mass of the switch assembly not to exceed 500 g in one embodiment.

FIGS. 1 through 7 schematically illustrate details of the switch assembly 100, which includes a base plate 10; a thermally-conductive electrically insulating layer 21 affixed to a first, bottom side of the base plate 10; a substrate/circuit layer 20 affixed to a second, top side of the base plate 10; a first terminal 11 and a second terminal 12; a driver board 40; a snubber board 50; a housing 60; and a heat exchanger 80 that includes a liquid-cooled base 84 that is arranged to house the first, bottom side of the base plate 10. As shown with reference to FIG. 3, the first terminal 11 includes a bottom portion 11a, and the second terminal 12 includes a bottom portion (not shown) which mount directly on the substrate/circuit layer 20 for electrical power conduction.

The switch assembly 100 is packaged in a housing 60 including cover 64 that is configured to retain and encapsulate the hardware, and may be wholly or partly made of an electrically insulating and rigid material, such as a rigid polymeric material. The mass of the switch assembly 100 preferably does not exceed 500 grams.

The base plate 10 is a rectangularly shaped planar device that is wholly or partly made of a thermally conductive material, such as a metal or a metal matrix composite. The thermally conductive electrically insulating layer 21 affixed to the first, bottom side of the base plate 10 may be wholly or partly made of copper, aluminum, molybdenum or alloys thereof, or metal matrix composites such as AlSiC or copper graphite foam, and may be mounted and thermally coupled to a heat sink 82. The heat sink 82 may include optimally shaped pin fins 83 that protrude from the bottom portion of the base plate 10, as illustrated with reference to FIG. 4B. The base plate 10 has a maximum thickness that is between two millimeters and three millimeters to minimize the overall size of the switch assembly 100.

The substrate/circuit layer 20 includes a thermally-conductive electrically insulating layer 21, a direct bonded substrate 22, a power transistor circuit 202, and a plurality of connector pins 23. The thermally-conductive electrically insulating layer 21 is affixed to the second, top side of the base plate 10. In one embodiment, the thermally-conductive electrically insulating layer 21 is thermally conductive. The thermally-conductive electrically insulating layer 21 may be fabricated wholly or partially from a ceramic or a polymeric material. Suitable ceramic materials for the electrically insulating layer 21 include, but are not limited to, aluminum oxide ($Al_2O_3$), Aluminum Nitride (AlN), Aluminum Silicon Carbide (AlSiC), Silicon Nitride ($Si_3N_4$), Diamond, Gallium Oxide among others. Polymeric materials may include mylar, Kapton, etc.

The switch assembly 100 may include a solder layer disposed between the base plate 10 and the substrate/circuit layer 20 to connect the base plate 10 to the thermally-conductive electrically insulating layer 21. The term "solder" means a low-melting alloy, especially one based on lead and tin or (for higher temperatures) on brass or silver, used for joining less fusible metals. The solder layer is directly disposed on the base plate 10 to facilitate and enhance the connection between the solder layer and the base plate 10. Each of the base plate 10, the thermally-conductive electrically insulating layer 21, and the solder layer has a planar shape to minimize the size coupled by the switch assembly 100.

A metallic sheet may be directly coupled to the thermally-conductive electrically insulating layer 21 to form the direct bonded substrate 22. The direct bonded substrate 22 has a thickness that is between 0.1 millimeter to 0.8 millimeters to minimize the size of the switch assembly 100. The direct bonded substrate 22 may be directly bonded to the electrically insulating and thermally conductive layer 21. The metallic sheet may be wholly or partly made of copper, and therefore form a direct bonded copper (DBC) substrate in conjunction with the thermally-conductive electrically insulating layer 21. The metallic sheet may be wholly or partly made of aluminum to form a direct bonded aluminum (DBA) substrate in conjunction with the thermally-conductive electrically insulating layer 21. The metallic sheet may be directly coupled and directly disposed on the solder layer to enhance the structural integrity of the switch assembly 100. As such, the metallic sheet is disposed on top of the substrate/circuit layer 20 (e.g., ceramic layer). In other words, the metallic sheet is bonded to the substrate/circuit layer 20.

The power transistor circuit 202 of substrate/circuit layer 20 is implemented as an arrangement of solid-state power transistors 204 that can be controlled to manage and control electric power flow between the first terminal 11 and the second terminal 12. One embodiment of the power transistor circuit 202 is described with reference to FIGS. 8 and 9.

The first terminal 11 and the second terminal 12 are affixed to the direct bonded substrate 22 and electrically connected to the power transistor circuit 202. The first terminal 11 and the second terminal 12 are power terminals capable of transferring high levels of electric power, and have integrated provisions such as tapped holes and sensor/snubber mounting arrangements that provide for external connections.

The driver circuit 40 includes the power transistor control circuit 200, which is described with reference to FIGS. 8 and 9.

The snubber board 50 is an electrical circuit that includes, in one embodiment, one or more resistors and one or more capacitors arranged in parallel with pairs of the power transistors 204 to absorb or otherwise mitigate overvoltage spikes that may occur during a reverse recovery process. Alternatively, the snubber board 50 may be a transient voltage suppressor or a varistor that is arranged in parallel. The paired arrangement of the power transistors 204 is shown with reference to FIGS. 8 and 9.

The heat exchanger 80 includes heat sink 82 and liquid-cooled base 84. The heat sink 82 may be mounted and thermally coupled to a bottom portion of the base plate 10. The heat sink 82 may include optimally shaped pin fins 83 that protrude from the bottom portion. The liquid-cooled base 84 includes a prismatically-shaped section 85 that defines a bath portion 86, a fluidic inlet 87, and a fluidic outlet 88. The fluidic inlet 87 and fluidic outlet 88 are fluidly coupled to a remotely located fluidic coolant system that includes, in one embodiment, a fluidic pump that circulates coolant between the liquid-cooled base 84 and a fluid-air heat exchange element, e.g., a radiator.

The base plate 10 is assembled onto the liquid-cooled base 84 with the heat sink 82 being inserted into the bath portion 86. In operation, coolant circulates through the bath portion 86 to remove heat from the switch assembly 100.

Figure 8:
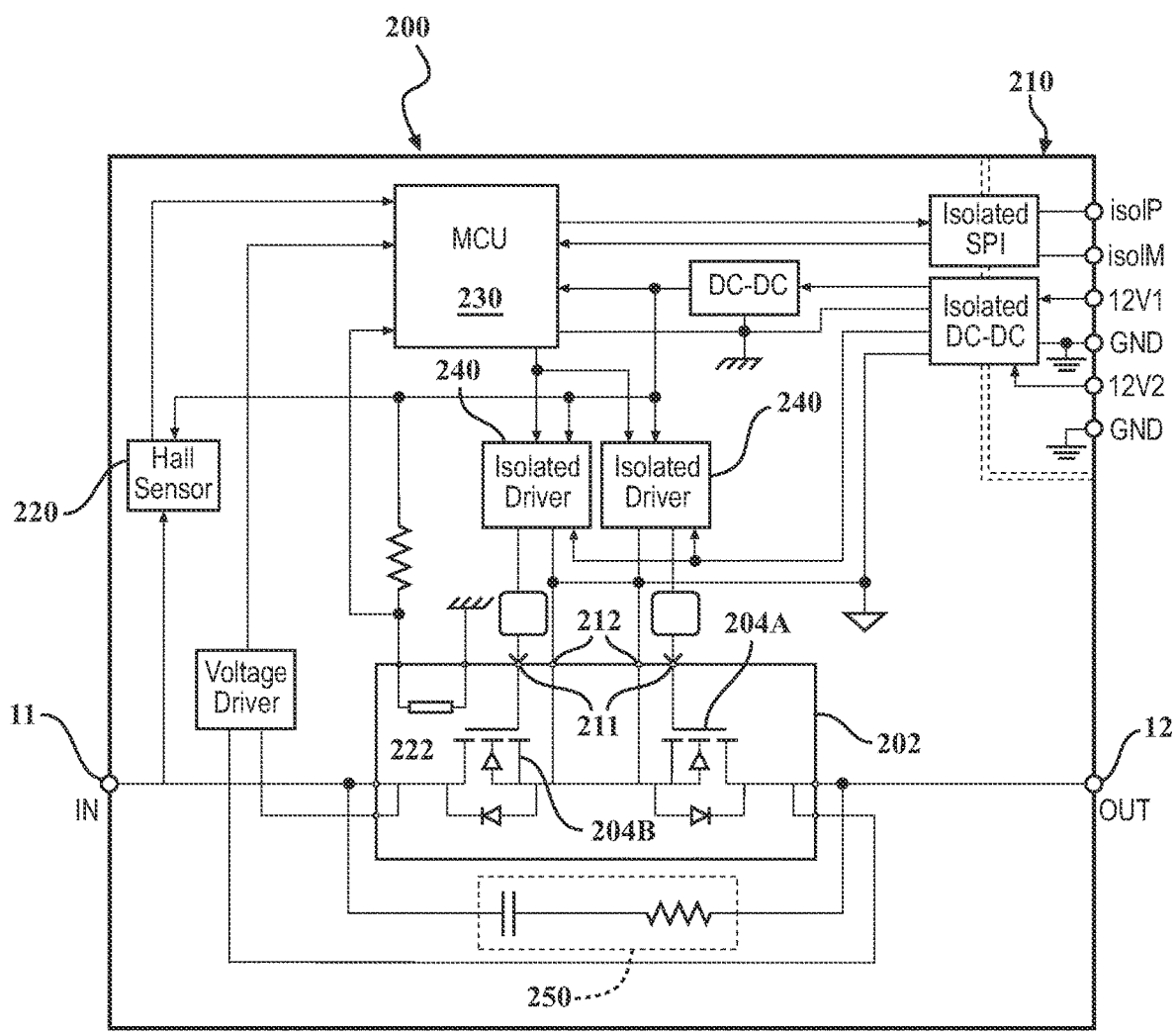
FIGS. 8 and 9 schematically illustrate details of an embodiment of the power transistor control circuit that may be implemented as an element of the switch assembly, in accordance with the disclosure.
Figure 9:
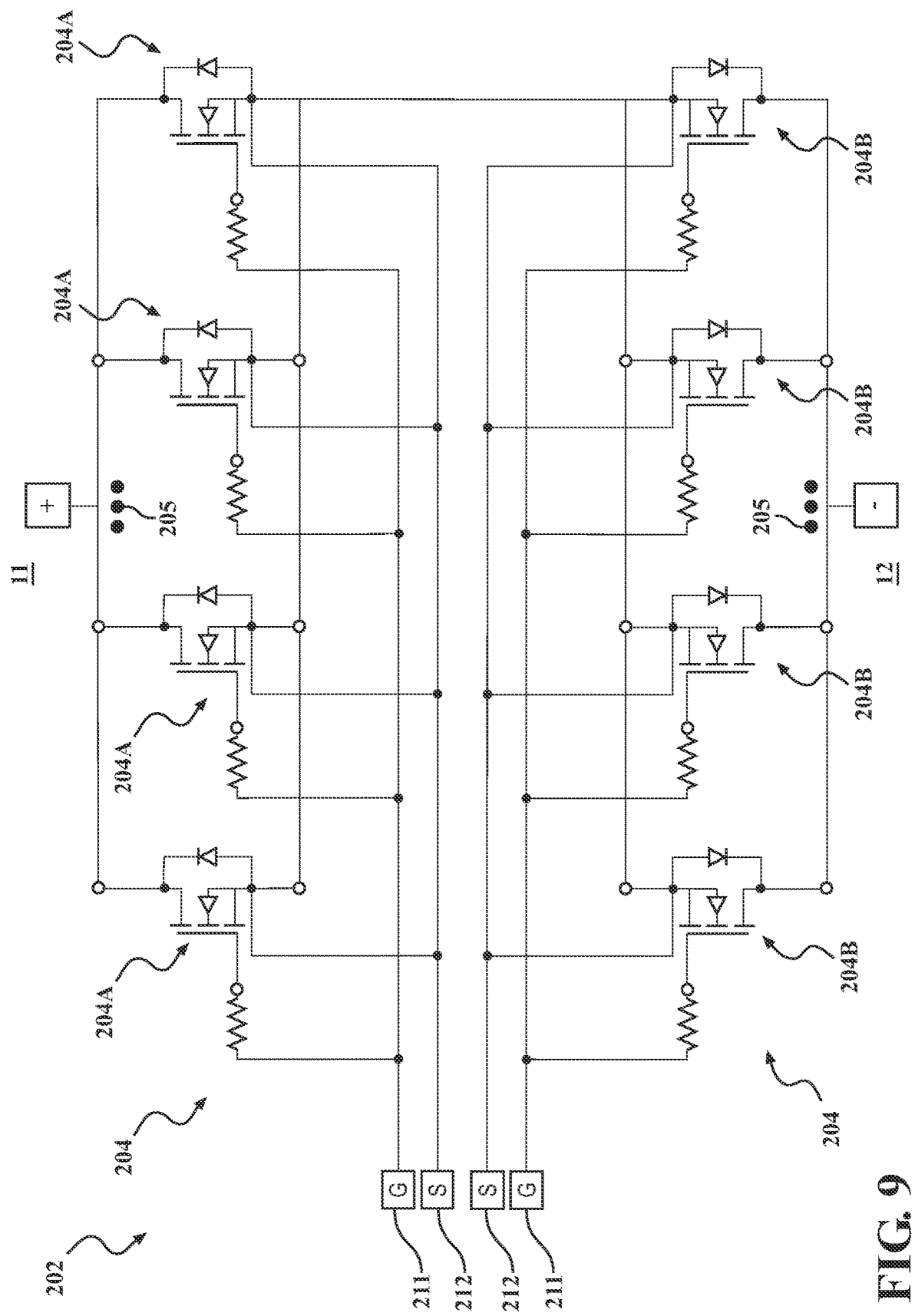

FIGS. 8 and 9 schematically illustrate details of an embodiment of the power transistor control circuit 200 that may be implemented as an element of the switch assembly 100. The power transistor control circuit 200 is part of the substrate/circuit layer 20, and includes power transistor circuit 202 that is composed of an arrangement of a plurality of power transistors 204, which are arranged to include a first subset 204A of the plurality of power transistors 204 and a second subset 204B of the plurality of power transistors 204. The power transistor control circuit 200 is arranged to manage and control the power transistor circuit 202 to control electric power flow through the plurality of the power transistors 204 between the first terminal 11 and the second terminal 12. The control of electric power flow through the plurality of power transistors 204 includes enabling electric power flow when controlled to a first state, and blocking electric power flow when controlled to a second state. FIG. 9 schematically illustrates one arrangement of the power transistor circuit 202.

Each of the power transistors 204 is a metal-oxide-semiconductor field-effect transistor (MOSFET) in one embodiment, and includes a source terminal S, a gate terminal G, and a drain terminal. Each of the power transistors has a minimum area of twenty square millimeters to share and carry 400 A current, in one embodiment.

Each of the power transistors 204 includes a semiconductor material, such as silicon, silicon carbide, gallium oxide, and gallium nitride, graphene, or diamond.

The power transistors 204 are arranged in a predetermined pattern to maintain substantially equal current and temperature distribution in the power transistor circuit 202 and the substrate. Each of the power transistors 204 has a specific ON resistance that is less than 3.5 to 4.5 m-$\Omega m^2$ in one embodiment. The placement of the power transistors 204 and the pattern of the direct bonded substrate is selected to achieve equal current distribution and low parasitic inductance. The switch assembly 100 may include a plurality of damping resistors each electrically connected to the gate terminal of a respective one of the power transistors in series to prevent or at least minimize power oscillations.

The plurality of power transistors 204 are electrically connected in parallel to achieve scalable current rating (e.g., a multiple of 100 A), and the switch assembly 100 includes the substrate/circuit layer 20 with a predetermined thermal stack height and pattern.

For optimal thermal management, spacing between adjacent power transistors is greater than 1 millimeter and less than 3 millimeters. The term "spacing" means a distance between the edge of one of the power transistors and a closest edge of the adjacent one of the power transistors.

The power transistors 204 of the power transistor control circuit 200 are able to block at least 500V DC in either a first direction of current flow or a second direction of current flow when controlled to the off-state, and may have different stack lengths. The power transistors 204 of the power transistor control circuit 200 are able to carry an electrical current of at least 300 A when controlled to the on-state with a low ON state resistance. The power transistors 204 are electrically connected in parallel for scalability in a minimum package size with an isolation resistance that is greater than 50 Mohms and different stack lengths. The substrate/circuit layer 20 may have predetermined thermal stack heights and pattern to provide required thermal capabilities.

The power transistor control circuit 200 includes a driver circuit 240, which includes a plurality of gate drivers 242 that are coupled to the plurality of power transistors 204 to control operation thereof.

The power transistor control circuit 200 includes a serial or discrete communication interface 210, which is an isolated serial interface that is arranged to communicate with another controller, e.g., a vehicle master controller, via a connector 42. The communication interface 210 may be an isolated controller area network (isoCAN) and/or an isolated serial peripheral interface (isoSPI) arrangement. Other inputs to the communication interface 210 include 12V DC power lines (12V1, 12V2), electrical ground (GND), etc.

The power transistor control circuit 200 includes a current sensor 220. The current sensor 220 is a non-dissipative differential current sensor that is integrated into one of the first terminal 11 (as shown) or the second terminal 12 at a cutout portion 221, as illustrated with reference to FIG. 3. In one embodiment, the current sensor 220 is a non-dissipative differential magnetic field-based current sensor having high bandwidth and low response time. The current sensor 220 is advantageously integrated into either the first terminal 11 or the second terminal 12, wherein the respective terminal is shaped to produce high bandwidth differential magnetic fields from the current flowing in it. The current sensor 220 is in communication with controller 230. In one embodiment, the current sensor 220 is a Hall effect sensor. A Hall effect sensor or another magneto-resistive sensing device (e.g., AMR, TMR, GMR) may be employed. The power transistor control circuit 200 includes one or multiple temperature sensors 222 that monitor temperature(s) in the power transistor control circuit 200 and the switch assembly 100. The temperature sensor 222 may be a thermistor in one embodiment. Alternatively, the temperature sensor 222 may be a thermocouple device, an integrated circuit device (e.g., a positive temperature coefficient (PTC) or negative temperature coefficient (NTC) device, a diode, or another temperature monitoring device. The power transistor control circuit 200 includes a snubber circuit 250, which may include one or more resistors and one or more capacitors that are arranged in parallel with each of the pairs of the power transistors 204 to absorb or otherwise mitigate overvoltage spikes that may occur during a reverse recovery process.

As shown with reference to FIG. 9, the plurality of power transistors 204 are arranged in pairs and are in parallel on the direct bonded substrate between the first terminal 11 and the second terminal 12. The plurality of power transistors 204 are arranged in four pairs as shown, with scalability indicated by ellipses 205. Scalability indicates that there can be four pairs of the power transistors 204 (as shown), five pairs of the power transistors 204, six pairs of the power transistors 204, etc., without limitation. The plurality of power transistors 204 are arranged in parallel to achieve a scalable current rating between 200 A and 2,000 A, wherein the scalable current rating is based upon a quantity of the pairs of the power transistors 204 arranged in parallel.

The gates (G) of each of the plurality of power transistors 204 are electrically connected in parallel, as indicated at 211, which connect to the plurality of gate drivers 242 of the driver circuit 240. The sources (S) of each of the plurality of power transistors 204 are electrically connected in parallel as indicated at 212, and also connected to the plurality of gate drivers 242 of the driver circuit 240. The drains of the first subset 204A of the plurality of power transistors 204 are electrically connected to the first terminal 11. The drains of the second subset 204B of the plurality of power transistors 204 are electrically connected to the second terminal 12.

The controller 230 is in communication with the plurality of gate drivers 242 via the driver circuit 240, the current sensor 220, the temperature sensor 222, and the communication interface 210. The controller 230 is configured to control, via the plurality of gate drivers 242, the plurality of power transistors 202. The controller 230 controls operation of the driver circuit 240, which includes the plurality of gate drivers 242 that are coupled to the gates (G) of the plurality of the power transistors 204 to control operation thereof. The controller 230 controls operation of the electrical circuit 200 to control the switch assembly 100 to one of an on-state or an off-state.

The term "controller" and related terms such as microcontroller, control, control unit, processor, etc. refer to one or various combinations of Application Specific Integrated Circuit(s) (ASIC), Field-Programmable Gate Array(s) (FPGA), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning, buffer circuitry and other components, which can accessed by and executed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms, and similar terms mean controller-executable instruction sets including calibrations and look-up tables. Each controller executes control routine(s) to provide desired functions. Routines may be executed at regular intervals, for example every 100 microseconds during ongoing operation. Alternatively, routines may be executed in response to occurrence of a triggering event. Communication between controllers, actuators and/or sensors may be accomplished using a direct wired point-to-point link, a networked communication bus link, a wireless link, or another communication link. Communication includes exchanging data signals, including, for example, electrical signals via a conductive medium; electromagnetic signals via air; optical signals via optical waveguides; etc. The data signals may include discrete, analog and/or digitized analog signals representing inputs from sensors, actuator commands, and communication between controllers.

The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium.

A parameter is defined as a measurable quantity that represents a physical property of a device or other element that is discernible using one or more sensors and/or a physical model. A parameter can have a discrete value, e.g., either "1" or "0", or can be infinitely variable in value.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. An electronic solid-state switch assembly, comprising:
   a base plate and a heat exchanger;
   a thermally conducting, electrically insulating layer affixed to a bottom portion of the base plate and a direct bonded substrate affixed to the base plate;
   a first terminal and a second terminal;
   a plurality of power transistors;
   a plurality of gate drivers;
   a communication interface, a current sensor, and a snubber circuit; and
   a controller;
   wherein the heat exchanger includes a plurality of pin fins protruding from a bottom portion of the thermally conducting, electrically insulating layer;
   wherein the plurality of gate drivers are operatively coupled to the plurality of power transistors;
   wherein the plurality of power transistors are arranged in parallel on the direct bonded substrate between the first terminal and the second terminal;
   wherein the plurality of power transistors are electrically connected to the first terminal and to the second terminal;
   wherein the controller is in communication with the plurality of gate drivers, the current sensor, and the communication interface; and
   wherein the controller is configured to control, via the plurality of gate drivers, the plurality of power transistors.

2. The electronic solid-state switch assembly of claim 1, wherein the heat exchanger includes a heat sink portion and a liquid cooled base; and, wherein the heat sink portion is thermally coupled to the base plate.

3. The electronic solid-state switch assembly of claim 2, wherein the heat sink portion comprises a pin-finned heat sink.

4. The electronic solid-state switch assembly of claim 1, wherein the electrically insulating layer comprises a ceramic isolator, and wherein the direct bonded substrate comprises one of a direct bonded copper substrate or a direct bonded aluminum substrate.

5. The electronic solid-state switch assembly of claim 1, wherein the electrically insulating layer is thermally conductive.

6. The electronic solid-state switch assembly of claim 1, wherein the electronic solid-state switch assembly is controllable to one of an on-state or an off-state, wherein and the electronic solid-state switch assembly is arranged to block greater than 500V in either a first direction of current flow or a second direction of current flow when controlled to the off-state.

7. The electronic solid-state switch assembly of claim 6, wherein the electronic solid-state switch assembly is configured to carry an electrical current of at least 300A when controlled to the on-state.

8. The electronic solid-state switch assembly of claim 1, wherein the plurality of power transistors arranged in parallel comprises one of a plurality of Si IGBT power transistors, a plurality of SiC JFET transistors, a plurality of Si/SiC MOSFET transistors, or a plurality of GaN FET transistors.

9. The electronic solid-state switch assembly of claim 1, wherein the plurality of power transistors arranged in parallel comprises a plurality of a combination of Si IGBT transistors, SiC JFET transistors, Si/SiC MOSFET transistors, and GaN FET power transistors.

10. The electronic solid-state switch assembly of claim 9, wherein each of the plurality of one or more of Si IGBT, SiC JFET, Si/SiC MOSFET, GaN FET power transistors has a minimum surface area of 20 mm$^2$.

11. The electronic solid-state switch assembly of claim 1, wherein the plurality of power transistors are arranged in parallel to achieve a scalable current rating between 200A and 2,000A, wherein the scalable current rating is based upon a quantity of the power transistors that are arranged in parallel.

12. The electronic solid-state switch assembly of claim 1, further comprising a temperature sensor arranged to monitor temperature therein.

13. The electronic solid-state switch assembly of claim 1, wherein the snubber circuit includes a combination of a resistor and a capacitor, wherein the resistor and the capacitor are sized to limit overvoltage during a switch-off event.

14. The electronic solid-state switch assembly of claim 1, wherein the current sensor comprises a non-dissipative differential current sensor that is integrated into one of the first terminal or the second terminal.

15. The electronic solid-state switch assembly of claim 1, wherein the current sensor comprises a non-dissipative differential magnetic field based current sensor that is integrated into one of the first terminal or the second terminal.

16. The electronic solid-state switch assembly of claim 1, wherein the electrically insulating layer comprises a ceramic material.

17. The electronic solid-state switch assembly of claim 1, wherein the base plate is fabricated from at least one of copper, aluminum, molybdenum, an alloy thereof, or a thermally conductive metal matrix composite.

18. The electronic solid-state switch assembly of claim 1, wherein the communication interface comprises an isolated bidirectional serial communication link that is coupled to a second controller.

19. A bi-directional electronic solid-state switch assembly, comprising:
   a base plate including a thermally conductive, electrically insulating layer and a direct bonded substrate affixed to the base plate;
   a first terminal and a second terminal;
   a plurality of power transistors electrically connected in parallel between the first and second terminals;
   a plurality of gate drivers arranged to control the plurality of power transistors;
   a communication interface, a current sensor, and a snubber circuit; and
   a controller, the controller being in communication with the plurality of gate drivers, the current sensor, and the communication interface;
   a thermally conducting, electrically insulating layer affixed to a bottom portion of the base plate and a direct bonded substrate affixed to the base plate; and
   a heat exchanger coupled to a posterior of the thermally conducting, electrically insulating layer;
   wherein the controller is configured to control, via the plurality of gate drivers, the plurality of power transistors; and
   wherein the heat exchanger includes a plurality of pin fins protruding from a bottom portion of the thermally conducting, electrically insulating layer.

20. The bi-directional electronic solid-state switch assembly of claim 19, wherein the plurality of power transistors electrically connected in parallel comprises a plurality of a combination of Si IGBT transistors, SiC JFET transistors, Si/SiC MOSFET transistors, and GaN FET power transistors.

* * * * *